US005771297A

United States Patent [19]

Richardson

[11] Patent Number: 5,771,297

[45] Date of Patent: Jun. 23, 1998

[54] ELECTRONIC AUDIO DEVICE AND METHOD OF OPERATION

[75] Inventor: Julian Howard Richardson, Basingstoke, England

[73] Assignee: Motorola, Inc., Schaumburg, Ill.

[21] Appl. No.: 514,546

[22] Filed: Aug. 14, 1995

[51] Int. Cl.$^{6}$ .................................................... H03G 3/20

[52] U.S. Cl. ................................ 381/57; 381/96; 381/108

[58] Field of Search ................................ 381/56, 57, 58, 381/59, 96, 104, 107, 108

[56] References Cited

U.S. PATENT DOCUMENTS

| | | | |
|---|---|---|---|
| 4,395,588 | 7/1983 | Franssen | 381/96 |
| 4,628,526 | 12/1986 | Germer | 381/57 |

FOREIGN PATENT DOCUMENTS

| | | |
|---|---|---|
| 0 036 230 A1 | 9/1981 | European Pat. Off. . |
| 0 119 645 A1 | 9/1984 | European Pat. Off. . |
| 0 119 791 A1 | 9/1984 | European Pat. Off. . |
| 0 171 065 A1 | 2/1986 | European Pat. Off. . |
| 0 508 392 A2 | 10/1992 | European Pat. Off. . |
| 2132651 | 6/1984 | United Kingdom . |
| WO 84/00274 A1 | 1/1984 | WIPO . |

*Primary Examiner*—Minsun Oh Harvey
*Attorney, Agent, or Firm*—M. Mansour Chomeshi

[57] ABSTRACT

An electronic audio device, such as a radio having an audio loudspeaker is described, as well as a method of operation of such a device. The device has an audio stage (6) having an audio output for providing an audio output signal, an acoustic transducer (12) coupled to the audio output for outputting an acoustic signal and a microphone element (13) acoustically coupled to the acoustic transducer to provide a feedback signal representative of the output of the acoustic transducer. A comparison circuit (15) compares parameters of the audio output signal and parameters of the feedback signal; and a control circuit (16, 24, 50) responsive to the comparison circuit controls the audio stage when a parameter of the feedback signal differs from that parameter of the audio output signal by a predetermined amount.

10 Claims, 2 Drawing Sheets

6 8 7 9 12 13 14 GAIN AND PROCESSING 16 15

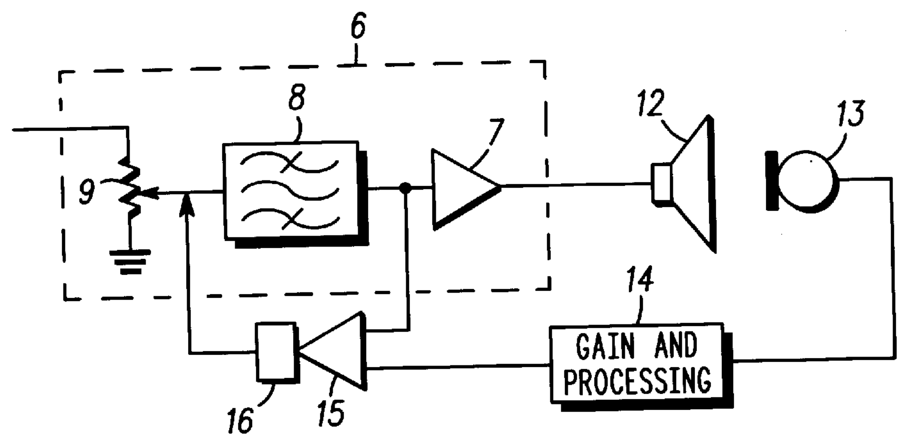
F I G. 1
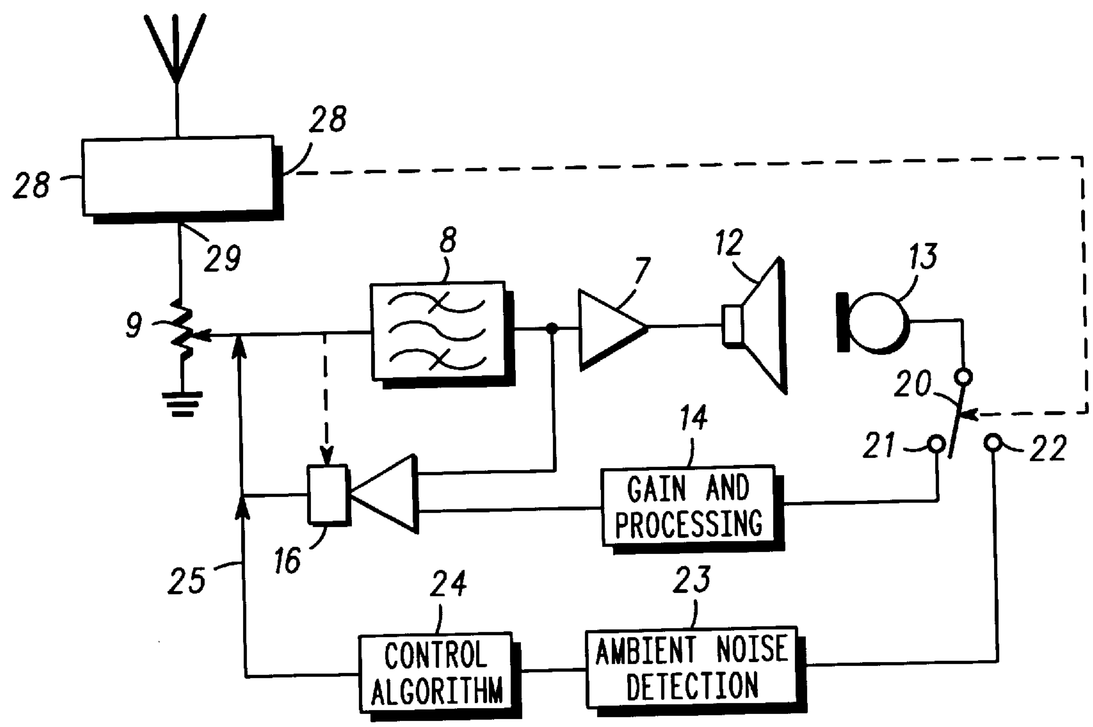
F I G. 2

ELECTRONIC AUDIO DEVICE AND METHOD OF OPERATION

FIELD OF THE INVENTION

This invention relates to an electronic audio device, such as a radio having an audio loudspeaker, and it relates to a method of operation of such a device. The invention is useful in many applications, an example being an adaptive audio system for land mobile radios.

BACKGROUND TO THE INVENTION

Although recent years have seen great progress in technology within portable and mobile radio equipment, a key area in which there has been relatively little improvement is the control of the acoustic interface between the radio receiver and a user.

However, based on the performance of this interface, the user makes critical performance judgements of the entire radio system. This is particularly an issue with portable units due to the necessarily small size of the loudspeaker.

Technology efforts have been directed towards improving loudspeakers and loudspeaker mountings, yet the performance of sophisticated finest digital signal processing technology and vocoder technology can be negated by a rattling or overloaded loudspeaker. Investment in improved loudspeaker technology is not a complete solution since such overloading may occur through incorrect setting of the volume control by the user.

Examination of the reasons for poor perceived audio performance also highlight a well-known dilemma with volume level setting. As users transit from high to low noise environments, they are expected manually to adjust the volume to a reasonable level. Sometimes, users forget and as a result either do not hear messages in high noise environments or become annoyed by excess volume when moving to a low noise environment. It is known in commercial AM-FM car radios to have a microphone to sense ambient noise and adjust the volume control, but this is a limited improvement. In addition, due to the need for reserve audio gain (well understood by those skilled in the art) it is possible to select a high volume setting which causes overload of the loudspeaker on certain signals.

There is therefore a perceived need for automatic control of the acoustic interface with the user.

BRIEF DESCRIPTION OF THE DRAWINGS

FIG. 1 shows a first embodiment of a circuit in accordance with the present invention.

FIG. 2 shows a second embodiment of a circuit in accordance with the present invention.

DETAILED DESCRIPTION OF THE PREFERRED EMBODIMENTS

Figure 3:
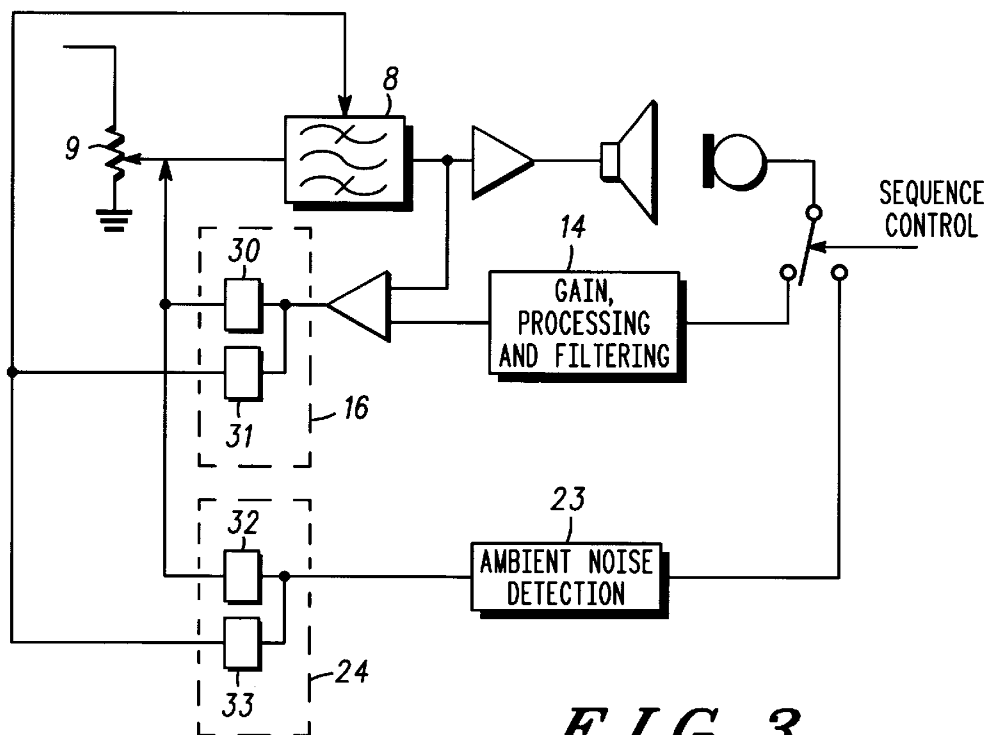
FIG. 3 shows a third embodiment of a circuit in accordance with the present invention.

Referring to FIG. 1 a basic circuit in accordance with the invention is shown. It comprises an audio stage 6 consisting of an audio amplifier 7, an audio filter 8 and a volume control element 9. The output of the amplifier 7 is connected to a loudspeaker 12 or earpiece or other acoustic transducer. Mounted in a position for acoustic coupling from the loudspeaker 12 is a microphone element 13. The microphone element can be mounted in front of the loudspeaker cone as shown, or indeed, could be mounted behind the loudspeaker cone. The microphone element 13 could indeed be built into the loudspeaker cone, that is to say being a sensor that measures the loudspeaker cone vibration. These comments apply in the case where some other transducer is used such as an earpiece having a diaphragm rather than a cone. The microphone element 13 provides an output to gain and processing circuitry 14, which is connected to a first input of a comparison circuit 15. A second input of the comparison circuit 15 is connected to the input of the amplifier 7. The comparison circuit 15 provides an output to control element 16 which may be a processor device having a control algorithm. The control element 16 provides control to the volume control element 13.

The entire device is housed in a single housing (not shown).

In operation, the microphone element 13 senses acoustic output from the loudspeaker 12 and provides a feedback signal which is processed in gain processing element 14 and compared in comparison circuit 15 with the signal input to the amplifier 7. As the volume level increases, there will be a point at which the two signals cease to resemble each other. This occurs when the loudspeaker is rattling or overloaded. This may be due to incorrect volume level setting by the user and/or loudspeaker deficiencies. The control element 16 senses this difference between the input signal and the feedback signal and operates to control the volume through control element 12. In its simplest form, the control element 16 operates to reduce the volume to the loudspeaker.

This arrangement, while potentially limiting the maximum output of the loudspeaker, ensures that serious overloading is avoided.

The comparison circuit 15 and control element 16 can be combined to perform more complicated comparisons. Thus, for example, different parameters of the input and feedback signals can be compared such as volume levels at different frequencies. In this manner, the circuit can be made more sensitive to frequencies associated with loudspeaker rattle, for example. Other parameters can be compared to establish when the feedback signal is distorted relative to the audio signal fed to the amplifier.

In a second embodiment of the invention, the microphone element 13 is additionally used to monitor ambient noise levels and additional processing is provided. As shown in FIG. 2, the output from the microphone element 13 passes to a switch 20. This switch has a first notional position 21 in which the microphone element provides its output to the gain and processing circuitry 14 and a second notional position 22, which connects the microphone to ambient noise detection circuitry 23. The ambient noise detection circuitry 23 provides an output to a control element 24, which provides volume control through control line 25 to volume control element 13. Also shown in FIG. 2 is a radio receiver 28, which provides an audio output 29 to the volume control element 9 and also provides a squelch detection output 30 to control the switch 20. Typically a squelch detection output gives an indication of the presence of received carrier with base band modulation.

The operation is as follows. When there is an incoming message, the squelch detection output provides an “open squelch” signal, causing the switch 22 switch to its notional left-hand position as shown, allowing the gain processing circuitry 14 and comparator 15 to control distortion in the loudspeaker 12. In the absence of an incoming signal, the switch 20 switches to its right-hand position as shown, allowing the ambient noise detection circuitry 23 to use the microphone 13 to detect the level of ambient noise and causing the algorithm of the control element 24 to adjust the volume control 9 accordingly. The ambient noise detection circuitry 23 and control element 24 in effect perform an integration function having a long time constant, so that adjustment for ambient noise is made over a relatively long time period. The gaining processing circuitry 14 has a relatively short integration time constant, causing relatively rapid attenuation of the audio signal in the event of distortion in the loudspeaker.

The gain and processing circuitry 14 has a relatively low gain with respect to the ambient noise detection circuitry 23, so that the microphone 13 effectively operates in a high gain mode to sense ambient noise and a relatively low gain mode to sense loudspeaker distortion.

The switch 20 is not essential. With appropriate processing circuitry in control element 16 and control element 24, and with appropriate time constant and gain factors, overall control of the volume can be carried out merely on the basis of the signal from the microphone 13.

The actual volume control setting on the radio 28 can also be used to adjust the control algorithms used to determine the final volume level, illustrated by the dotted line from point "A".

Note that in a portable communications device it is evident that the microphone may also serve for the transmitter input transducer by the use of further switching and appropriate control circuits not illustrated.

Information on ambient noise level can be used to modify the frequency response of the audio filter 8, in order to permit high volume levels with high intelligibility but low distortion. This is illustrated in the embodiment of FIG. 3.

Elements of FIG. 3 are already shown in FIG. 2. It can be seen that control element 16 comprises volume control element 30 and frequency response control element 31, while control element 24 comprises volume control element 32 and frequency control element 33. The frequency control elements 31 and 33 provide control to the filter 8, which in this case is a filter having a controllable frequency characteristic. In this manner, in circumstances of high distortion, the lower frequencies can be attenuated to a greater degree than the higher frequencies. Lower frequencies cause greater loudspeaker rattle and are less important for message intelligibility.

The applicant has observed that it is generally the case for a distortion detection system that inputs and outputs are precisely bounded and defined outside the operational environment. With this observation, it is found that two adaptive feedback control loops may not, in fact, be the optimum embodiment for all types of equipment. For this reason, a preferred embodiment of the invention is now described, which uses a feed-forward control arrangement relying on a pre-programmed set of amplitude/frequency/distortion parameters.

Figure 4:
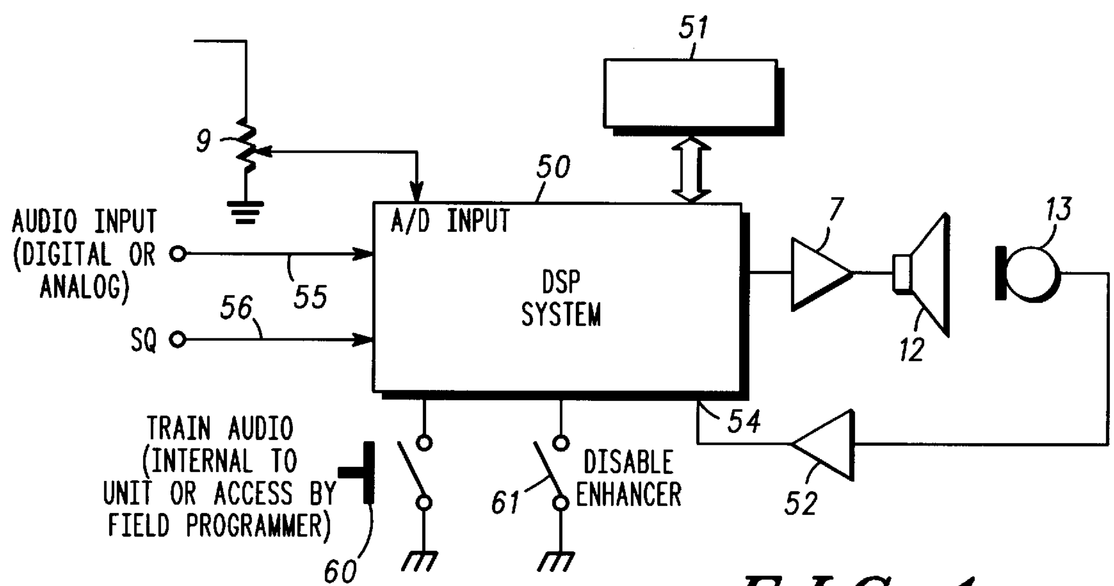
FIG. 4 shows a fourth embodiment of a circuit in accordance with the present invention.

Referring to FIG. 4, the audio filter 8, gain and processing circuitry 14, comparison circuit 15 and control elements 16 and 24 of FIG. 3 are replaced by a digital signal processor (DSP) 50 having a memory 51. The audio control element 9 remains as a simple manual user controllable volume adjustment setting connected to an A/D input of the DSP 50. The microphone element 13 provides its signal to an amplifier 52, which provides an input to an A/D input 54. Two further inputs to the DSP 50 are provided, in the form of a "train audio" input 60 and a "disable enhancer" input 61.

The operation is as follows. By providing a "train audio" input to input 60 (for example from a field programmer or from a microprocessor in the radio or a switch in the radio), the DSP 50 generates a training audio sequence. This sequence is output to amplifier 7 and causes an audio signal to be emitted from the loudspeaker 12. This training sequence may be a complex audio waveform, for example a swept two-tone and/or single-tone sweep, and several sequences could be used. Several volume levels can also be used.

During this training mode of operation, the signal fed back from the microphone 13 and input to A/D input 54 is measured and the DSP 50 performs a comparison with the originally output signals. From this comparison, the DSP can derive distortion factors and all the information necessary to adapt audio gain and frequency response in the future to ensure maximum intelligibility under all ambient noise levels while compensating for the acoustic transducer characteristics. To do this, values are stored in memory 51 for different frequency outputs and different volume settings. These values represent gain factors to be used at those volumes and those frequencies. When all the gain values have been stored, and the training sequences finished, the signal 60 is removed and the processor ends its training mode and enters an operational mode. In the operational mode, an audio input is received from time to time at input 55, for outputting through the loudspeaker 12.

The audio input signal is monitored and the level adjusted at different frequencies by the factors stored in memory 51 before outputting to the amplifier 7. The DSP also has a squelch transmit control input 56, which can cause different adjustment values to be selected from the memory 51 depending on whether the squelch is opened or closed, i.e. whether the audio input is a received message or is other audio such as background noise or voice input to a microphone. This line is indicative of the intention to adapt the performance of the DSP based on other radio status parameters.

The arrangement described has the ability to adapt dynamically very rapidly, for example millisecond by millisecond, rather than over several syllables or seconds.

In summary, an audio processing system is presented which dynamically adapts volume level and frequency/phase response to optimise the acoustic performance of the specific loudspeaker system at all ambient noise levels.

A practical implementation is made possible by the use of DSP technology which also offers potential extension to compandor and other audio enhancement schemes. The DSP would also be present for other purposes in advanced equipment.

The system described is capable of adjusting system gain dynamically to avoid loudspeaker overload or acoustic rattles on a"per message" "per syllable" or "per millisecond" basis.

In the specific case of an audio system which derives its input from a digital vocoder, it is also possible to adapt dynamically the characteristics of the vocoder to achieve similar and enhanced results based on knowledge of the acoustic transducer performance and noise level of the environment.

This is illustrated by control line 62 in FIG. 4, which may also be used to adapt other parameters such as those relating to the demodulator or noise reduction circuitry.

In conclusion, the volume control on the unit is now used to indicate the user's preferred listening level relative to ambient noise. When high volume levels are required, the system dynamically adapts the system performance to optimise intelligibility, based on "a priori" knowledge of the acoustic transducer performance. This "a priori" knowledge is stored in a memory and may be considered the "acoustic calibration" of the unit which may be periodically recalibrated ("trained") to ensure optimum performance throughout the service life of the equipment. Where several transducers are used with a unit, a set of acoustic calibration data may be automatically and correctly invoked for each transducer, thereby ensuring optimum performance in all configurations.

I claim:

1. An electronic audio device comprising:

an audio stage having an audio output for providing an audio output signal;

an acoustic transducer coupled to the audio output for outputting an acoustic signal;

a microphone element with selectable gain, acoustically coupled to the acoustic transducer to provide a feedback signal representative of the output of the acoustic transducer;

a comparator coupled to the audio stage and the microphone element for comparing parameters of the audio output signal and parameters of the feedback signal;

a control circuit responsive to the comparator for controlling the audio stage when a parameter of the feedback signal differs from that parameter of the audio output signal by a predetermined amount;

a microphone gain switching element for increasing the gain of the microhone element for monitoring of ambient noise and decreasing the gain for provision of the feedback signal; and a volume control element for controlling the audio output signal responsive to the control circuit to reduce the volume of the acoustic signal when the difference between the feedback signal parameter and the audio output signal parameter indicates distortion in the audio output signal.

2. A device according to claim 1, further comprising an ambient noise monitoring element responsive to the feedback signal for controlling the audio stage to increase the volume of the audio output signal with increased ambient noise and decrease the audio output signal with decreased ambient noise.

3. A device according to claim 1, comprising a switching element for switching between provision of the feedback signal and ambient noise monitoring as a function of activity in the audio device.

4. A device according to claim 3, wherein the switching element is arranged to switch with changes of the output signal, to provide the feedback signal when there is a significant output signal and to monitor ambient noise when there is no significant output signal.

5. A device according to claim 2, comprising an integrator element for controlling the audio stage responsive to ambient noise changes over a relatively long time period and to control the audio stage responsive to the feedback signal over a relatively short period of time.

6. A device according to claim 2, wherein the frequency profile of the audio output signal is controlled responsive to the feedback signal.

7. A device according to claim 6, wherein lower frequencies of the audio signal are attenuated relative to higher frequencies when the parameter of the feedback signal differs from the parameter of the audio output signal by a predetermined amount.

8. A device according to claim 1, further comprising a storage element coupled to the comparator for storing control parameters, responsive to the feedback signal, wherein the control circuit is arranged to recall selected parameters for later control of the audio stage.

9. An electronic audio device comprising:

an audio stage having an audio output for providing an audio output signal;

an acoustic transducer coupled to the audio output for outputting an acoustic signal;

a microphone element acoustically coupled to the acoustic transducer to provide a feedback signal representative of the output of the acoustic transducer;

a comparator for comparing parameters of the audio output signal and parameters of the feedback signal;

a storage element coupled to the comparator;

a control circuit responsive to the comparator for controlling the audio stage when a parameter of the feedback signal differs from that parameter of the audio output signal by a predetermined amount; and a training audio output signal generator responsive to the control circuit for passing a training audio output signal to the audio stage, wherein the control circuit is arranged to cause control parameters to be stored in the storage element in response to the feedback signal provided by the microphone element when the training audio output signal is generated.

10. A method of operation of an electronic audio device comprising the steps of:

providing an audio output signal to an audio stage having an audio output and outputting an acoustic signal from an acoustic transducer coupled to the audio output;

receiving a representation of the acoustic signal at a microphone element and providing a feedback signal representative of the output of the acoustic transducer;

comparing parameters of the audio output signal and parameters of the feedback signal;

controlling the audio stage when a parameter of the feedback signal differs from that parameter of the audio output signal by a predetermined amount;

increasing the gain of the microphone element for monitoring of ambient noise and decreasing the gain for provision of the feedback signal controlling the audio output signal to reduce the level of the acoustic signal; and when the difference between the parameters of the feedback signal and the parameters of the audio output signal indicates distortion in the audio output signal.

* * * * *